United States Patent
Muramoto et al.

(10) Patent No.: US 12,382,757 B2
(45) Date of Patent: Aug. 5, 2025

(54) LIGHT EMITTING ELEMENT

(71) Applicant: NICHIA CORPORATION, Anan (JP)

(72) Inventors: Eiji Muramoto, Tokushima (JP); Takumi Otsuka, Anan (JP); Yuya Yamakami, Komatsushima (JP); Haruhiko Nishikage, Anan (JP); Shota Kammoto, Anan (JP); Akinori Kishi, Tokushima (JP)

(73) Assignee: NICHIA CORPORATION, Anan (JP)

( * ) Notice: Subject to any disclaimer, the term of this patent is extended or adjusted under 35 U.S.C. 154(b) by 415 days.

(21) Appl. No.: 18/159,279

(22) Filed: Jan. 25, 2023

(65) Prior Publication Data
US 2023/0246138 A1 Aug. 3, 2023

(30) Foreign Application Priority Data

Jan. 31, 2022 (JP) .................................. 2022-012849
Feb. 14, 2022 (JP) .................................. 2022-020101

(51) Int. Cl.
H10H 20/831 (2025.01)
H10H 20/81 (2025.01)
H10H 20/825 (2025.01)
H10H 20/857 (2025.01)

(52) U.S. Cl.
CPC .... H10H 20/8312 (2025.01); H10H 20/8215 (2025.01); H10H 20/825 (2025.01); H10H 20/857 (2025.01)

(58) Field of Classification Search
CPC .............. H10H 20/857; H10H 20/831; H10H 20/8312; H10H 20/8215; H10H 20/825; H10H 20/835; H10H 20/851; H10H 20/855
See application file for complete search history.

(56) References Cited

U.S. PATENT DOCUMENTS

| 6,445,011 B1 | 9/2002 | Hirano et al. |
| 2002/0145205 A1 | 10/2002 | Hirano et al. |
| 2006/0151793 A1 | 7/2006 | Nagai |
| 2009/0134425 A1 | 5/2009 | Nagai |

(Continued)

FOREIGN PATENT DOCUMENTS

| JP | H10-215034 A | 8/1998 |
| JP | 2000-286457 A | 10/2000 |

(Continued)

Primary Examiner — Zandra V Smith
Assistant Examiner — John M Parker
(74) Attorney, Agent, or Firm — Foley & Lardner LLP

(57) ABSTRACT

A light emitting element includes: a semiconductor structure including an n-side layer, a p-side layer, and an active layer, each being made of a nitride semiconductor, wherein the active layer is positioned between the n-side layer and the p-side layer and is configured to emit ultraviolet light; an n-electrode electrically connected to the n-side layer; and a p-electrode comprising a first metal layer in contact with the p-side layer and electrically connected to the p-side layer. The p-side layer comprises a first layer, a second layer disposed on the first layer, and a third layer disposed on the second layer, each containing a p-type impurity. A surface of the second layer includes an exposed region that is exposed from the third layer. The first layer and the second layer contain Al.

20 Claims, 3 Drawing Sheets

(56) References Cited

U.S. PATENT DOCUMENTS

| | | |
|---|---|---|
| 2010/0117056 A1 | 5/2010 | Nagai |
| 2011/0198567 A1 | 8/2011 | Shinohara et al. |
| 2012/0292646 A1 | 11/2012 | Nagai |
| 2013/0328013 A1 | 12/2013 | Inazu et al. |
| 2014/0021442 A1* | 1/2014 | Inazu ................ H10H 20/835 257/13 |
| 2014/0327034 A1 | 11/2014 | Toyota |
| 2019/0081215 A1 | 3/2019 | Inazu et al. |
| 2021/0057609 A1 | 2/2021 | Niwa et al. |
| 2021/0359162 A1 | 11/2021 | Niwa et al. |
| 2022/0320375 A1 | 10/2022 | Niwa et al. |

FOREIGN PATENT DOCUMENTS

| | | |
|---|---|---|
| JP | 2007-227832 A | 9/2007 |
| JP | 2007-529105 A | 10/2007 |
| JP | 2010-098234 A | 4/2010 |
| JP | 2013-105917 A | 5/2013 |
| JP | 2013-258277 A | 12/2013 |
| JP | 2014-057033 A | 3/2014 |
| JP | 2016-015413 A | 1/2016 |
| JP | 2017-220535 A | 12/2017 |
| JP | 2021-034473 A | 3/2021 |
| JP | 6839320 B1 | 3/2021 |
| WO | WO-2012/127660 A1 | 9/2012 |

\* cited by examiner

LIGHT EMITTING ELEMENT

CROSS-REFERENCE TO RELATED APPLICATION

This application claims priority to Japanese Patent Application No. 2022-012849, filed on Jan. 31, 2022, and Japanese Patent Application No. 2022-020101, filed on Feb. 14, 2022, the disclosures of which are hereby incorporated by reference in their entireties.

BACKGROUND

The present disclosure relates to a light emitting element.

Japanese Patent Publication No. 2017-220535 discloses a deep ultraviolet light emitting element comprising a plurality of nitride semiconductor layers. There is a need to improve the emission efficiency of such a light emitting element.

An object of certain embodiments of the present disclosure is to provide a high emission efficiency light emitting element.

A light emitting element according to one embodiment of the present disclosure comprises a semiconductor structure that includes an n-side layer, a p-side layer, and an ultraviolet light emitting active layer positioned between the n-side layer and the p-side layer, each being made of a nitride semiconductor, an n-electrode electrically connected to the n-side layer, and a p-electrode having a first metal layer in contact with the p-side layer and electrically connected to the p-side layer. The p-side layer has a first layer, a second layer disposed on the first layer, and a third layer disposed on the second layer, each containing a p-type impurity. The second layer has an exposed region in its surface exposed from the third layer. The first layer and the second layer contain Al. The third layer has a lower Al composition ratio than the Al concentration ratio of the second layer, or contains no Al. The second layer and the third layer are less in thickness than the first layer. The third layer has a higher p-type impurity concentration than the p-type impurity concentration of the second layer. The first metal layer is disposed in contact with the exposed region of the second layer and the surface of the third layer.

According to certain embodiments of the present disclosure, a high emission efficiency light emitting element can be provided.

DETAILED DESCRIPTION

Figure 1:
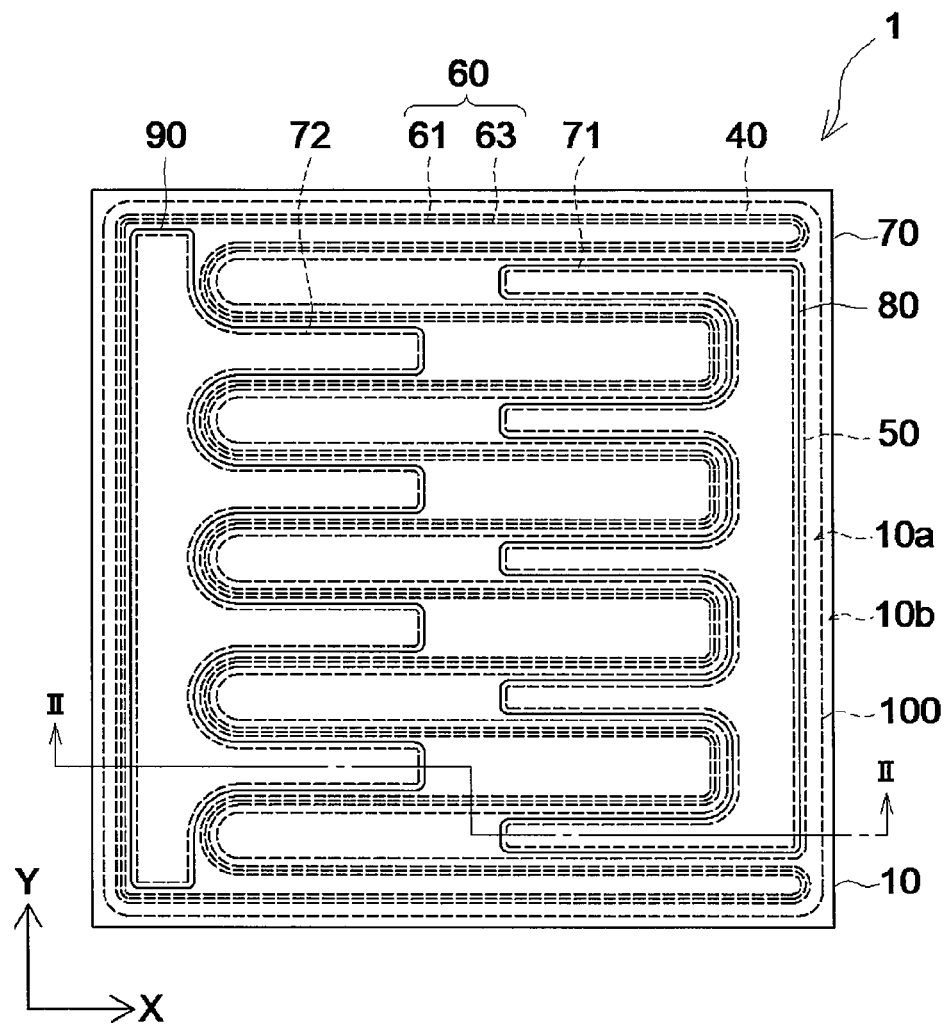
FIG. 1 is a schematic top view of the components of a light emitting element according to an embodiment of the present disclosure.

Certain embodiments of the present disclosure will be explained below. The drawings referenced in the following description are schematic representations of the present disclosure. As such, the scale, spacing, or positional relationships of the members might be exaggerated, or a certain portion of a member omitted. In the description below, the same reference numerals are used to denote the same members or those of similar quality for which detailed explanation might be omitted as appropriate.

Figure 2:
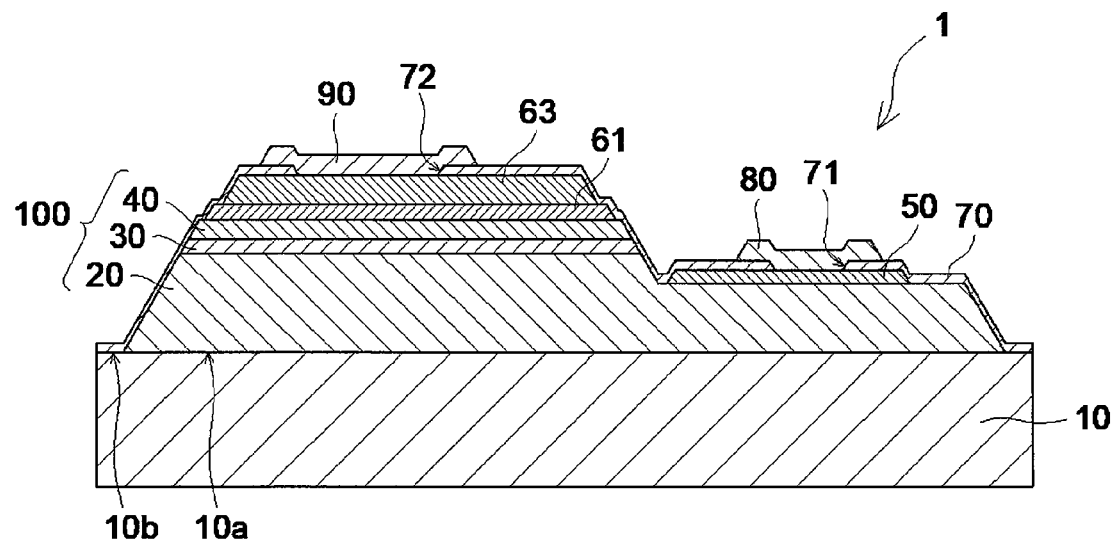
FIG. 2 is a schematic cross-sectional view of the components of the light emitting element taken along line II-II in FIG. 1.
Figure 3:
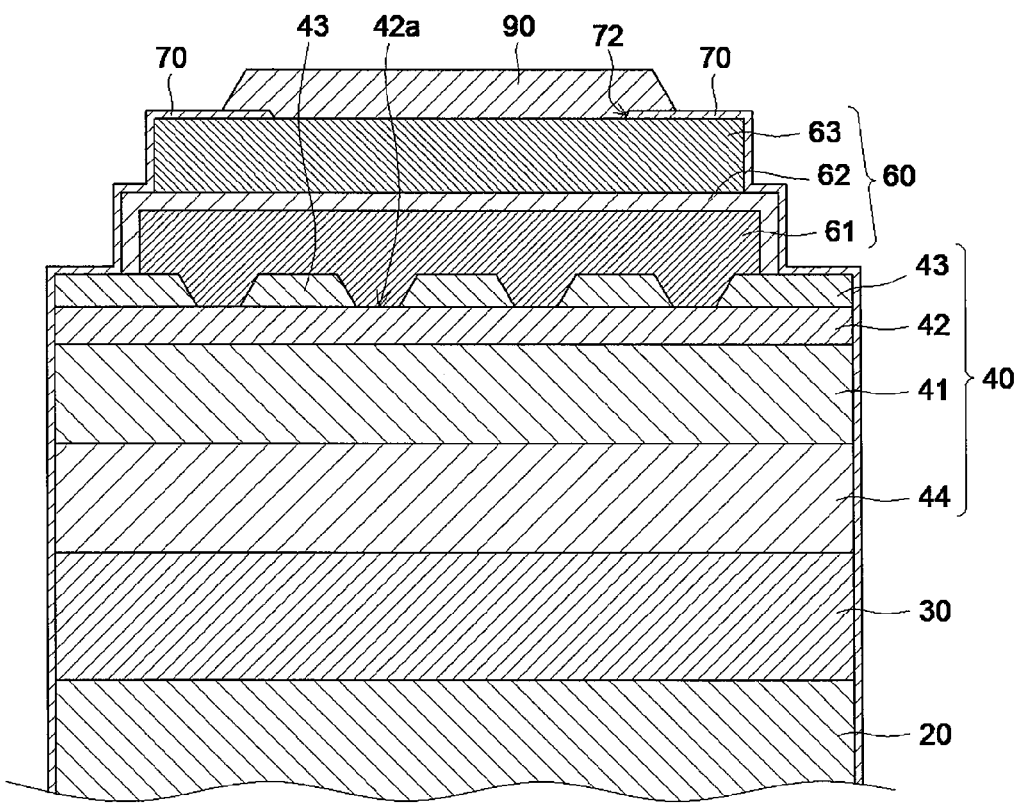
FIG. 3 is a schematic cross-sectional view of certain components of the light emitting element according to the embodiment of the present disclosure.
Figure 4:
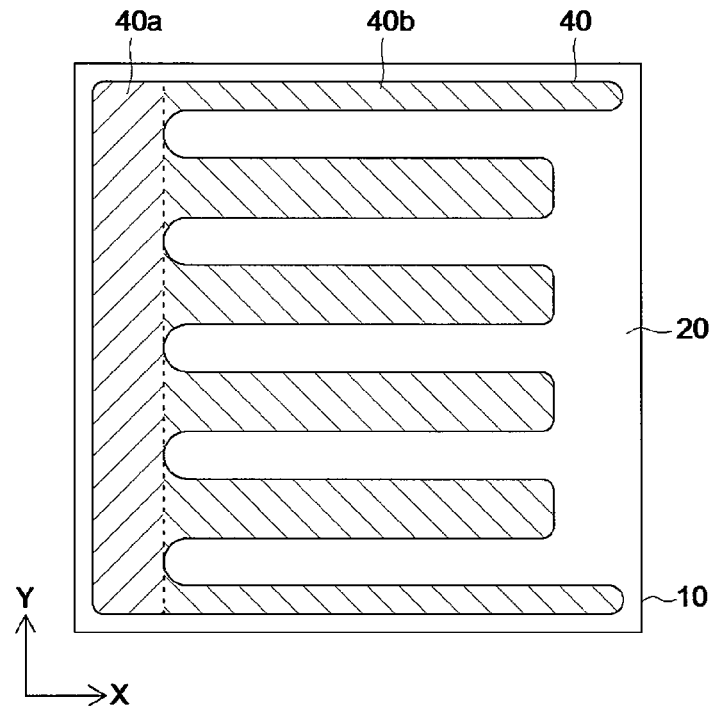
FIG. 4 is a schematic top view of certain components of the light emitting element according to the embodiment of the present disclosure.
Figure 5:
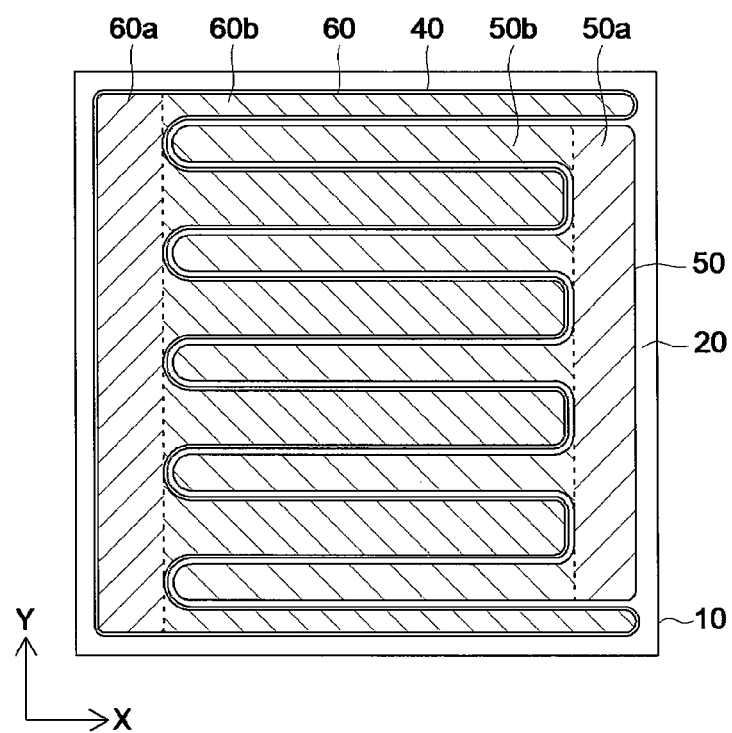
FIG. 5 is a schematic top view of certain components of the light emitting element according to the embodiment of the present disclosure.

FIG. 1 is a schematic top view of a light emitting element 1. FIG. 2 is a schematic cross-sectional view of the light emitting element 1 taken along line II-II in FIG. 1. FIG. 3 is a schematic cross-sectional view of a portion of the light emitting element 1. FIG. 4 is a schematic top view of certain components of the light emitting element 1. FIG. 5 is a schematic top view of certain components of the light emitting element 1. In FIGS. 4 and 5, the regions marked with hatching show the regions where members are disposed, not representing cross sections. Each member will be explained in detail below with reference to the drawings.

As shown in FIGS. 1 to 3, a light emitting element 1 has a substrate 10 and a semiconductor structure 100 formed on the substrate 10. The semiconductor structure 100 includes an n-side layer 20, a p-side layer 40, and an ultraviolet light emitting active layer 30 positioned between the n-side layer 20 and the p-side layer 40, each being made of a nitride semiconductor. The light emitting element 1 has an n-electrode 50 electrically connected to the n-side layer 20, and a p-electrode 60 electrically connected to the p-side layer 40. The p-electrode 60 has a first metal layer 61 in contact with the p-side layer 40. The light emitting element 1 further has an n-side terminal 80 electrically connected to the n-electrode 50 and a p-side terminal 90 electrically connected to the p-electrode 60.

For the material for the substrate 10, for example, sapphire, silicon (Si), gallium nitride (GaN), aluminum nitride (AlN), or the like can be used. A substrate 10 made of sapphire is preferable, as it has a high transmittance with respect to the ultraviolet light from the active layer 30. The semiconductor structure 100 can be disposed, for example, on C-plane of the sapphire substrate, and is preferably disposed on a face oblique to the C-plane of the sapphire substrate forming a 0.2 to 2 degree angle with the a-axis or the m-axis of the sapphire substrate. The thickness of the substrate 10 can be set, for example, in a range of 150 μm to 800 μm. The light emitting element 1 does not have to have a substrate 10.

A top view shape of the substrate 10 is, for example, quadrangular. In the case in which the top view shape of the substrate 10 is quadrangular, each side can be set in a range of about 500 μm to about 2000 μm in length. The upper face of the substrate 10 has a first region 10a where a semiconductor structure 100 is disposed and a second region 10b where no semiconductor structure 100 is disposed. When viewed from above, the first region 10a is surrounded by the second region 10b. The boundary between the first region 10a and the second region 10b is located 10 μm to 30 μm from the outline of the substrate 10. Here, as shown in FIG. 1, a direction parallel to one side of the substrate is denoted as a first direction X, and the direction orthogonal to the first direction X is denoted as a second direction Y.

A semiconductor structure 100 is a stack structure in which nitride semiconductor layers are stacked. The nitride semiconductor can be any semiconductor obtained by varying the composition ratio x and y within their ranges in the chemical formula $In_xAl_yGa_{1-x-y}N$ ($0 \leq x \leq 1$, $0 \leq y \leq 1$, $x+y \leq 1$).

A buffer layer may be disposed between the substrate 10 and the semiconductor structure 100. For the buffer layer, for example, an AlN layer can be used. The buffer layer functions to reduce lattice mismatch between the substrate 10 and the nitride semiconductor layers disposed on the buffer layer. The thickness of the buffer layer can be set, for example, in a range of 1.5 μm to 4 μm. In the present specification, the thickness of each semiconductor layer refers to the thickness in the stacking direction of the semiconductor structure 100.

An n-side layer 20 includes one or more n-type semiconductor layers. Examples of n-type semiconductor layers include semiconductor layers containing an n-type impurity, such as silicon (Si), germanium (Ge), or the like. An n-type semiconductor layer is, for example, an AlGaN layer containing aluminum (Al), gallium (Ga), and nitrogen (N), and may contain indium (In). For example, the n-type impurity concentration of an n-type semiconductor layer containing Si as an n-type impurity is in a range of $5\times10^{18}/cm^3$ to $1\times10^{20}/cm^3$. The n-side layer 20 has only to have the function of supplying electrons, and may include an undoped layer. Here, an undoped layer is a layer not intentionally doped with an n-type impurity or a p-type impurity. In the case where an undoped layer is adjacent to a layer intentionally doped with an n-type impurity and/or a p-type impurity, the undoped layer might contain the n-type impurity and/or the p-type impurity diffused from the adjacent layer.

An n-side layer 20 includes, for example, a superlattice layer, an underlayer, and an n-contact layer successively from the substrate 10 side.

The superlattice layer may be, for example, a multilayer structure in which first semiconductor layers and second semiconductor layers having a different lattice constant from that of the first semiconductor layers are alternately formed. The superlattice layer has the function of reducing the stress occurring in the semiconductor layers disposed above the superlattice layer. The superlattice layer can be a multilayer structure in which AlN layers and aluminum gallium nitride (AlGaN) layers are alternately stacked. The number of pairs of first and second semiconductor layers in the superlattice layer can be set in a range of 20 to 50 pairs.

The underlayer may be, for example, an undoped AlGaN layer. In the case of using an AlGaN layer as the underlayer, the Al composition ratio of the AlGaN layer can be set, for example, in a range of 50% or higher.

The n-contact layer may be, for example, an AlGaN layer containing an n-type impurity. In the case of using an AlGaN layer as the n-contact layer, the Al composition ratio of the AlGaN layer can be set, for example, in a range of 50% or higher. In the present specification, an AlGaN layer having an Al composition ratio of 50%, for example, means that the composition ratio x in the chemical formula $Al_xGa_{1-x}N$ is 0.5. The n-type impurity concentration of the n-contact layer can be set, for example, in a range of $5\times10^{18}/cm^3$ to $1\times10^{20}/cm^3$.

The n-contact layer has an upper face on which no semiconductor layer is disposed. An n-electrode 50 is disposed on a portion of the upper face of the n-contact layer on which no semiconductor layer is disposed.

An active layer 30 is disposed between an n-side layer 20 and a p-side layer 40. The active layer 30 emits ultraviolet light. The peak emission wavelength of the ultraviolet light emitted by the active layer 30 is in a range of, for example, 220 nm to 350 nm.

The active layer 30 has a well layer containing Al and a barrier layer containing Al. The active layer 30 has, for example, a multiple quantum well structure including a plurality of well layers and a plurality of barrier layers. The Al composition ratio of a barrier layer is higher than the Al composition ratio of a well layer. In other words, the band gap energy of a barrier layer is larger than the band gap energy of a well layer. From a well layer containing Al, light having an emission wavelength corresponding to the band gap energy is emitted. The structure of the active layer 30 is not limited to a multiple quantum well structure that includes a plurality of well layers, and may be a single quantum well structure. An n-type impurity and/or p-type impurity may be contained in at least some of the well layers and the barrier layers.

The well layer may be, for example, a layer made of AlGaN. The barrier layer may be, for example, a layer made of AlGaN. The Al composition ratio of a well layer can be set, for example, in a range of 30% to 50%. In the in which the well layer is configured to emit light having a peak emission wavelength of about 280 nm, for example, an AlGaN layer having an Al composition ratio of about 42% can be used for the well layer. The Al composition ratio of a barrier layer can be set, for example, in a range of 30% to 60%.

The thickness of a well layer can be set, for example, in a range of 3 nm to 6 nm. The thickness of a barrier layer is in a range of, for example, 2 nm to 4 nm.

An electron blocking layer may be disposed between an active layer 30 and a p-side layer 40. The electron block layer is disposed for the purpose of reducing overflow of electrons supplied from the n-side layer 20. The electron blocking layer can be a multilayer structure having a plurality of semiconductor layers containing Al. The electron blocking layer can be a multilayer structure including, for example, an AlN layer, a first AlGaN layer, and a second AlGaN layer successively from the active layer 30 side. The Al composition ratio of the first AlGaN layer is lower than the Al composition ratio of the second AlGaN layer, and higher than the Al composition ratio of the well layers. The electron blocking layer is preferably a semiconductor layer having a higher Al composition ratio than the Al composition ratio of the barrier layers. This can reduce electron overflow. This can also reduce the amount of light from the well layers that is absorbed by the electron blocking layer, thereby improving the light extraction efficiency. The electron blocking layer may be, for example, an undoped AlGaN layer, undoped AlN layer, or the like. The thickness of the electron blocking layer can be set, for example, in a range of 5 nm to 15 nm.

In general, in order to reduce the amount of light from the active layer 30 that is absorbed by a semiconductor layer to thereby increase the light extraction efficiency, a semiconductor layer having high light transmissivity with respect to the light from the active layer 30 is preferably used as a p-side layer 40. For example, using as a p-side layer 40 an AlGaN layer having a higher Al composition ratio than the Al composition ratio of the well layers of the active layer 30 can make it difficult for the p-side layer 40 to absorb the light from the active layer 30. However, an AlGaN layer having a high Al composition ratio has larger band gap energy than a GaN layer or the like. For this reason, using an AlGaN layer having a high Al composition ratio as a p-side layer 40 results in inadequate conversion of the p-side layer 40 into a p-type layer or an increased contact resistance between the p-electrode 60 and the p-side layer 40. This makes it difficult for a light emitting element having an active layer that includes well layers made of AlGaN having a relatively high Al composition ratio to achieve both high light extraction efficiency and low forward voltage. In this embodiment, a p-electrode 60 is disposed on the p-side layer 40 described below which can improve the light extraction efficiency while reducing the contact resistance between the p-side layer 40 and the p-electrode 60. This can produce a high emission efficiency light emitting element 1.

The p-side layer 40 includes one or more p-type semiconductor layers. Examples of p-type semiconductor layers include those that contain a p-type impurity such as magnesium (Mg), or the like. As shown in FIG. 3, the p-side layer 40 has, successively from the active layer 30 side, a first layer 41, a second layer 42 disposed on the first layer 41, and a third layer 43 disposed on the second layer 42, each containing a p-type impurity. The p-side layer 40 further has a fourth layer 44 disposed between the active layer 30 and the first layer 41. Furthermore, the surface of the second layer 42 has an exposed region 42a exposed from the third layer 43.

The first layer 41 and the second layer 42 contain Al, and the third layer 43 is a layer having a lower Al composition ratio than the Al composition ratio of the second layer or containing no Al. The p-type impurity concentration of the third layer 43 is higher than the p-type impurity concentration of the second layer 42. Disposing a first metal layer 61 in contact with the third layer 43 having a higher p-type impurity concentration than that of the second layer 42 can readily reduce the contact resistance between the first metal layer 61 and the p-side layer 40. However, since the Al composition ratio of the third layer 43 is lower than that of the second layer 42, the third layer 43 absorbs the light from the active layer 30 more readily than the second layer 42, which can degrade the light extraction efficiency.

In this embodiment, the first metal layer 61 of the p-electrode 60 is disposed in contact with the exposed region 42a of the second layer 42 and the surface of the third layer 43. Disposing the first metal layer 61 in contact with the exposed region 42a allows the interface between the first metal layer 61 and the second layer 42 to efficiently reflect the light from the active layer 30 while reducing the amount of light from the active layer 30 that is absorbed by the third layer 43. Furthermore, disposing the first metal layer 61 in contact with not only the second layer 42, but also the third layer 43 can reduce the contact resistance between the p-electrode 60 and the p-side layer 40 as compared to the case in which the first metal layer 61 is only in contact with the second layer 42. Disposing the first metal layer 61 in contact with both the surface of the second layer 42 and the surface of the third layer 43 can also improve the adhesion between the p-electrode 60 and the p-side layer 40 as compared to the case in which the first metal layer 61 is only in contact with the third layer 43.

Both the second layer 42 and the third layer 43 are less in thickness than the first layer 41. This can reduce the amount of light from the active layer 30 that is absorbed by the second layer 42 and the third layer 43, thereby improving the light extraction efficiency.

According to this embodiment, the light extraction efficiency can be increased while reducing the contact resistance between the p-side layer 40 and the p-electrode 60. Thus, a high emission efficiency light emitting element 1 can be achieved.

The second layer 42 has multiple exposed regions 42a, and the first metal layer 61 is disposed in contact with the exposed regions 42a. Increasing the number of contact regions between the first metal layer 61 and the exposed regions 42a can further increase the light extraction efficiency. When viewed from above, the exposed regions 42a are arranged as dots, for example. The exposed regions 42a are created when a third layer 43 is formed on the second layer 42 so as not to cover certain portions of the surface of the second layer 42. For example, exposed regions 42a may be formed by suitably adjusting the temperature and the ambient gas during the formation of the third layer 43 so as to expose portions of the surface of the second layer 42. Indentations attributable to V-pits are formed on the surface of the second layer 42 on which a third layer 43 is to be formed, and exposed regions 42a may be formed by not allowing the third layer 43 to cover the portions of the surface of the second layer 42 where the indentations are present. In this case, exposed regions 42a are formed on the surface of the second layer 42 in correspondence with the regions where V-pits are formed. Alternatively, exposed regions 42a may be formed by partially etching the third layer 43 formed on the second layer 42 to expose portions of the surface of the second layer 42.

The total contact area between the first metal layer 61 and the exposed regions 42a is preferably less than the total contact area between the first metal layer 61 and the third layer 43. This can reduce the degradation of the forward voltage Vf that can be caused by an increased contact area between the first metal layer 61 and the exposed regions 42a. The contact area between the first metal layer 61 and the exposed regions 42a is preferably set, for example, in a range of 3% to 30%, more preferably 5% to 20% of the contact area between the first metal layer 61 and the third layer 43 per unit area.

A thickness of the third layer 43 is preferably equal to or less than a thickness of the second layer 42. This can reduce the amount of light absorbed by the third layer 43. The thickness of the third layer 43 can be set, for example, in a range of 60% to 80% of the thickness of the second layer 42.

The thickness of the first layer 41 can be set, for example, in a range of 20 nm to 40 nm. The thickness of the second layer 42 is preferably set, for example, in a range of 3 nm to 20 nm, more preferably 3 nm to 15 nm. Setting the thickness of the second layer 42 as 3 nm or larger can facilitate the filling of V-pits, which are recesses formed on the upper face of the semiconductor layer on which the second semiconductor layer 42 is disposed. Setting the thickness of the second layer 42 as 20 nm or less can reduce the amount of light absorbed by the second layer 42. The thickness of the third layer 43 is preferably set, for example, in a range of 3 nm to 20 nm, more preferably 3 nm to 15 nm. Setting the thickness of the third layer 43 as 3 nm or larger can increase the effect of reducing the contact resistance between the p-electrode 60 and the third layer 43 more easily. Setting the thickness of the third layer 43 as 20 nm or less can reduce the amount of light absorbed by the third layer 43. The fourth layer 44 is larger in thickness than the third layer 43. The thickness of the fourth layer 44 can be set, for example, in a range of 60 nm to 100 nm.

The p-type impurity concentration of the second layer 42 and the p-type impurity concentration of the third layer 43 are both preferably higher than the p-type impurity concentration of the first layer 41. This makes it easier to supply holes from the p-side layer 40 to the active layer 30 as compared to the case in which the p-type impurity concentration of the third layer 43 of the second and third layers 42 and 43 is higher than the p-type impurity concentration of the first layer 41, thereby increasing the emission efficiency of the light emitting element 1.

The p-type impurity concentration of the second layer 42 and the p-type impurity concentration of the third layer 43 are both higher than the p-type impurity concentration of the fourth layer 44. The p-type impurity concentrations of the first layer 41, the second layer 42, the third layer 43, and the fourth layer 44 are in a range of, for example, $1 \times 10^{19}/\text{cm}^3$ to $1 \times 10^{21}/\text{cm}^3$.

The Al composition ratio of the first layer 41 is preferably higher than the Al composition ratio of the second layer 42. The light extraction efficiency can be increased by setting a higher Al composition ratio for the first layer 41, which is positioned closer to the active layer 30 than the second layer 42, than the Al composition ratio of the second layer 42 to thereby reduce the amount of light absorbed by the first layer 41.

The Al composition ratio of the second layer 42 is preferably higher than the Al composition ratio of the well layers. This can further reduce the amount of light absorbed by the second layer 42 while allowing the interface between the second layer 42 and the first metal layer 61 to efficiently reflect light, thereby increasing the light extraction efficiency.

The Al composition ratio of the first layer 41 can be set, for example, in a range of 60% to 70%. The Al composition ratio of the second layer 42 is preferably set, for example, in a range of 30% to 60%, more preferably 40% to 55%. Setting the Al composition ratio of the second layer 42 to 30% or higher can reduce the amount of light absorbed by the second layer 42. Setting the Al composition ratio of the second layer 42 to 60% or lower can reduce the degradation of the contact resistance between the second layer 42 and the first metal layer 61. The Al composition ratio of the third layer 43 is preferably set, for example, to 3% or lower. This can promote the conversion of the third layer 43 into a p-type layer to further improve the emission efficiency. The Al composition ratio of the fourth layer 44 is higher than the Al composition ratio of the first layer 41 and lower than the Al composition ratio of the semiconductor layer in the electron blocking layer in contact with the fourth layer 44 (the second AlGaN layer). This facilitates the supply of holes from the p-electrode 60 side to the active layer 30.

The first layer 41 is made of aluminum gallium nitride, for example. The second layer 42 is made of aluminum gallium nitride, for example. The third layer 43 is made of gallium nitride or aluminum gallium nitride, for example. The fourth layer 44 is made of aluminum gallium nitride, for example. The first layer 41, the second layer 42, the third layer 43, and the fourth layer 44 may contain In.

FIG. 4 is a schematic diagram showing only the substrate 10, the n-side layer 20, and the p-side layer 40 among the components of the light emitting element 1. As shown in FIG. 4, when viewed from above, the p-side layer 40 has a base 40a extending along the second direction Y and a plurality of extended parts 40b extending from the base 40a along the first direction X. In the second direction Y, the n-side layer 20 is located between the extended parts 40b of the p-side layer 40.

The n-electrode 50 is disposed on the n-contact layer of the n-side layer 20 and electrically connected to the n-side layer 20. The p-electrode 60 is disposed on the second layer 42 and the third layer 43 of the p-side layer 40, and electrically connected to the p-side layer 40.

FIG. 5 is a schematic diagram showing only the substrate 10, the n-side layer 20, the p-side layer 40, the n-electrode 50, and the p-electrode 60 among the components of the light emitting element 1. As shown in FIG. 5, the n-electrode 50 has an n-side base 50a extending along the second direction Y and a plurality of n-side extended parts 50b extending from the n-side base 50a along the first direction X.

For the n-electrode 50, for example, metals, such as silver (Ag), Al, nickel (Ni), gold (Au), rhodium (Rh), titanium (Ti), platinum (Pt), molybdenum (Mo), tantalum (Ta), tungsten (W), and ruthenium (Ru), or alloys having these metals as main components can be used. The n-electrode 50 can be, for example, a multilayer structure that includes multiple metal layers. The n-electrode 50 can be a multilayer structure including, successively from the n-side layer 20 side, a Ti layer, an Al alloy layer, a Ta layer, and a Ru layer, for example.

As shown in FIG. 5, when viewed from above, the p-electrode 60 has a p-side base 60a extending along the second direction Y and a plurality of p-side extended parts 60b extending from the p-side base 60a along the first direction X. In the second direction Y, the n-side extended parts 50b and the p-side extended parts 60b are arranged alternately. Among the p-side extended parts 60b, those that are located at both ends in the second direction Y are larger in length in the first direction X than the other p-side extended parts 60b. Furthermore, among the p-side extended parts 60b, those that are located at both ends in the second direction Y are less in length in the second direction Y than the other p-side extended parts 60b. The outline of the p-electrode 60 is positioned inward of the outline of the p-side layer 40.

The p-electrode 60 is disposed to reflect the light from the active layer 30 that is advancing to the p-electrode 60 towards the n-side layer 20. The p-electrode 60 has a first metal layer 61 disposed in contact with the exposed regions 42a of the second layer 42 and the surface of the third layer 43. For the p-electrode 60, for example, a similar metal to that for the n-electrode 50 described above can be used.

The first metal layer 61 has a high reflectance with respect to the light from the active layer 30. The first metal layer 61 preferably includes a metal that has, for example, a reflectance of 60% or higher with respect to the light from the active layer 30. The first metal layer 61 preferably includes, for example, Rh or Ru as such a metal.

The first metal layer 61 preferably further includes Au. This can increase the adhesion between the first metal layer 61 and the p-side layer 40 while maintaining a high reflectance as compared to the case in which the first metal layer 61 is made only of Rh or Ru, for example. The first metal layer 61 can be a multilayer structure that includes, for example, a Rh layer, an Au layer, and a Ni layer, or a multilayer structure that includes a Ru layer, an Au layer, and a Ni layer. The first metal layer 61 can be a multilayer structure that includes an alloy layer containing Rh or Ru as well as Au and/or Ni.

The thickness of the first metal layer 61 is preferably set in a range of 100 nm to 200 nm. Setting the thickness of the first metal layer 61 to 100 nm or larger allows the first metal layer to easily achieve the effect of reflecting the light from the active layer 30. Setting the thickness of the first metal layer 61 to 200 nm or less can reduce the cost of the light emitting element 1. The thickness of the first metal layer 61 is the thickness from the surface of the third layer 43.

As shown in FIGS. 2 and 3, the p-electrode 60 has a second metal layer 62 covering the surface of the first metal layer 61, and a third metal layer 63 disposed above the first metal layer 61. The third metal layer 63 is electrically connected to the first metal layer 61 via the second metal layer 62. As shown in FIG. 1, the third metal layer 63 is less in width than the first metal layer 61 in the second direction Y. The width of the third metal layer 63 in the second direction Y can be set, for example, in a range of 60% to 80% of the width of the first metal layer 61.

The second metal layer 62 preferably contains Ni. A portion of the second metal layer 62 is covered by the insulating layer 70 described later. Covering the surface of the first metal layer 61 with the second metal layer 62 that contains Ni can improve the adhesion between the p-electrode 60 and the insulating layer 70 as compared to the case in which the insulating layer 70 is in contact with the surface of the first metal layer 61. The second metal layer 62 disposed between the first metal layer 61 and the third metal layer 63 can improve the adhesion between the first metal layer 61 and the third metal layer 63. For the second metal layer 62, an alloy containing Ni and Au may be used. The thickness of the second metal layer 62 can be set, for example, in a range of 5 nm to 20 nm.

The third metal layer 63 contains a metal, such as Rh, Ru, or the like, or an alloy having these metals as main components. The third metal layer 63 may be a multilayer structure that includes multiple metal layers. The third metal layer 63 can be a multilayer structure that includes, successively from the second metal layer 62 side, a Ti layer, a Rh layer, and a Ti layer, or a multilayer structure that includes a Ti layer, a Ru layer, and a Ti layer. The thickness of the third metal layer 63 can be set in a range of 100 nm to 700 nm. In the case of making the third metal layer 63 as the multilayer structure that includes two Ti layers described above, the Ti layer of the two Ti layers that is positioned on the second metal layer 62 side is disposed to improve the adhesion between the second metal layer 62 and the third metal layer 63. The Ti layer of the two Ti layers that is positioned on the second metal layer 62 side can be larger in thickness than the Ti layer of the two Ti layers that is positioned on the p-side terminal 90 side. A Ti layer more readily absorbs the ultraviolet light from the active layer 30 as compared to a Rh or Ru layer to reduce the light extraction efficiency. This embodiment, however, has a structure that allows the first metal layer 61 to reflect the portion of the light from the active layer 30 that advances towards the third metal layer 63. Accordingly, even if the Ti layer of the two Ti layers that is positioned on the second metal layer 62 side is relatively thick, the degradation of the light extraction efficiency can be reduced while improving the adhesion between the second metal layer 62 and the third metal layer 63. The thickness of the Ti layer of the two Ti layers that is positioned on the second metal layer 62 side can be set, for example, in a range of 30 nm to 70 nm. The thickness of the Ti layer of the two Ti layers that is positioned on the p-side terminal 90 side can be set, for example, in a range of 5 nm to 20 nm.

As shown in FIGS. 1 to 3, an insulating layer 70 covers the semiconductor structure 100, the n-electrode 50, the p-electrode 60, the n-side terminal 80, and the p-side terminal 90. The insulating layer 70 further covers the second region 10b of the substrate 10. The insulating layer 70 has a first opening 71 that exposes a portion of the surface of the n-electrode 50 and a second opening 72 that exposes a portion of the surface of the p-electrode 60. The insulating layer 70 covers the second metal layer 62, the third metal layer 63, and the third layer 43. For the insulating layer 70, a material having insulation properties is used. For the insulating layer 70, for example, $SiO_2$, SiON, or the like can be used. The thickness of the insulating layer 70 can be set, for example, in a range of 1 μm to 2 μm.

An n-side terminal 80 is disposed on the n-electrode 50 and is electrically connected to the n-electrode 50 at the first opening 71. A portion of the n-side terminal 80 is disposed on the insulating layer 70. When viewed from above, the n-side terminal 80 has a shape that corresponds to the shape of the first opening 71, and the outline of the n-side terminal 80 is positioned outward from the outline of the first opening 71.

For the n-side terminal 80, for example, a metal, such as Ni, Au, Ti, Pt, W, or the like, or an alloy having these metals as main components can be used. The n-side terminal 80 can be a multilayer structure that includes, successively from the n-electrode 50 side, a Ti layer, a Pt layer, and an Au layer. The thickness of the n-side terminal 80 can be set, for example, in a range of 500 nm to 1500 nm.

A p-side terminal 90 is disposed on the p-electrode 60 and is electrically connected to the p-electrode 60 at the second opening 72. A portion of the p-side terminal 90 is disposed on the insulating layer 70. When viewed from above, the p-side terminal 90 has a shape that corresponds to the shape of the second opening 72, and the outline of the p-side terminal 90 is positioned outward from the outline of the second opening 72.

For the p-side terminal 90, a metal similar to any of those for the n-side terminal 80 described above can be used. The p-side terminal 90 can be, for example, a multilayer structure that includes, successively from the p-electrode 60 side, a Ti layer, a Pt layer, and an Au layer. The thickness of the p-side terminal 90 can be set, for example, in a range of 500 nm to 1500 nm.

When a forward voltage is applied across the n-side terminal 80 and the p-side terminal 90, a forward voltage applies across the p-side layer 40 and the n-side layer 20, supplying holes and electrons to the active layer 30 to thereby allow the active layer 30 to emit light.

In the foregoing, certain embodiments of the present invention have been explained with reference to specific examples. The present invention, however, is not limited to these specific examples. All forms implementable by a person skilled in the art by suitably making design changes based on any of the embodiments of the present invention described above also fall within the scope of the present invention so long as they encompass the subject matter of the present invention. Furthermore, various modifications and alterations within the spirit of the present invention that could have been made by a person skilled in the art also fall within the scope of the present invention.

What is claimed is:

1. A light emitting element comprising:
   a semiconductor structure comprising an n-side layer, a p-side layer, and an active layer, each being made of a nitride semiconductor, wherein the active layer is positioned between the n-side layer and the p-side layer and is configured to emit ultraviolet light;
   an n-electrode electrically connected to the n-side layer; and
   a p-electrode comprising a first metal layer in contact with the p-side layer and electrically connected to the p-side layer; wherein:
   the p-side layer comprises a first layer, a second layer disposed on the first layer, and a third layer disposed on the second layer, each containing a p-type impurity;
   a surface of the second layer includes an exposed region that is exposed from the third layer;
   the first layer and the second layer contain Al;
   an Al composition ratio of the third layer is lower than an Al composition ratio of the second layer, or the third layer contains no Al;
   a thickness of the second layer and a thickness of the third layer are less than a thickness of the first layer;

a p-type impurity concentration of the third layer is higher than a p-type impurity concentration of the second layer; and the first metal layer is disposed in contact with the exposed region of the second layer and a surface of the third layer.

2. The light emitting element according to claim 1, wherein the first metal layer contains Rh or Ru.

3. The light emitting element according to claim 2, wherein the first metal layer further contains Au.

4. The light emitting element according to claim 3, wherein:

the p-electrode further comprises a second metal layer covering a surface of the first metal layer and containing Ni; and the light emitting element further comprises an insulating layer covering the second metal layer and the third layer.

5. The light emitting element according to claim 3, wherein the thickness of the third layer is equal to or less than the thickness of the second layer.

6. The light emitting element according to claim 3, wherein an Al composition ratio of the first layer is higher than the Al composition ratio of the second layer.

7. The light emitting element according to claim 2, wherein:

the p-electrode further comprises a second metal layer covering a surface of the first metal layer and containing Ni; and the light emitting element further comprises an insulating layer covering the second metal layer and the third layer.

8. The light emitting element according to claim 2, wherein a thickness of the first metal layer is in a range of 100 nm to 200 nm.

9. The light emitting element according to claim 2, wherein the thickness of the third layer is equal to or less than the thickness of the second layer.

10. The light emitting element according to claim 2, wherein the p-type impurity concentration of the third layer is in a range of $1\times10^{19}/cm^3$ to $1\times10^{21}/cm^3$.

11. The light emitting element according to claim 2, wherein an Al composition ratio of the first layer is higher than the Al composition ratio of the second layer.

12. The light emitting element according to claim 2, wherein:

the active layer comprises a well layer containing Al; and an Al composition ratio of the well layer is in a range of 30% to 50%.

13. The light emitting element according to claim 2, wherein the thickness of the second layer is in a range of 3 nm to 20 nm, and the thickness of the third layer is in a range of 3 nm to 20 nm.

14. The light emitting element according to claim 1, wherein a thickness of the first metal layer is in a range of 100 nm to 200 nm.

15. The light emitting element according to claim 1, wherein the thickness of the third layer is equal to or less than the thickness of the second layer.

16. The light emitting element according to claim 1, wherein the p-type impurity concentration of the third layer is in a range of $1\times10^{19}/cm^3$ to $1\times10^{21}/cm^3$.

17. The light emitting element according to claim 1, wherein an Al composition ratio of the first layer is higher than the Al composition ratio of the second layer.

18. The light emitting element according to claim 1, wherein:

the active layer comprises a well layer containing Al; and an Al composition ratio of the well layer is in a range of 30% to 50%.

19. The light emitting element according to claim 1, wherein the thickness of the second layer is in a range of 3 nm to 20 nm, and the thickness of the third layer is in a range of 3 nm to 20 nm.

20. The light emitting element according to claim 1, wherein the first layer and the second layer are made of aluminum gallium nitride, and the third layer is made of gallium nitride.

* * * * *